United States Patent [19]

Roennau et al.

[11] 4,230,770
[45] Oct. 28, 1980

[54] METAL PHOTOPOLYMER SUBSTRATES

[75] Inventors: Raymond B. Roennau, Stow; Daniel A. Chung, North Canton; Shirish Jasani, Monroe Falls, all of Ohio

[73] Assignee: The Goodyear Tire & Rubber Company, Akron, Ohio

[21] Appl. No.: 949,314

[22] Filed: Oct. 6, 1978

[51] Int. Cl.$^2$ .................... B32B 27/40; G03C 5/00
[52] U.S. Cl. ................... 428/424.4; 148/6.2; 204/159.19; 428/424.6; 428/425.8; 430/276
[58] Field of Search ............ 428/425; 148/6.2, 6.16, 148/6.27; 260/859 R; 96/35.1, 115 P; 204/159.19

[56] References Cited

U.S. PATENT DOCUMENTS

| | | | |
|---|---|---|---|
| 3,279,958 | 10/1966 | Maurer et al. | 148/6.16 |
| 3,748,190 | 7/1973 | Weber et al. | 148/6.27 |
| 3,826,651 | 7/1974 | Weber et al. | 148/6.2 |
| 4,057,431 | 11/1977 | Finelli et al. | 260/859 R |
| 4,139,436 | 2/1979 | Jasani | 96/35.1 |

Primary Examiner—Thomas J. Herbert, Jr
Attorney, Agent, or Firm—J. D. Wolfe

[57] ABSTRACT

The present invention is directed to a composite laminated article including a resin coated base plate and a layer of ordered photocurable composition on said resin coated plate and when the liquid photocurable composition is cured forms a polymeric printing plate. The article includes a sheet of aluminum-containing metal having a coating of a cured mixture of a specific vinyl resin and an epoxy resin and preferably a small amount of carbon black and silica and a top coat or layer of photocured ordered polyurethane containing acrylate or methacrylate radicals.

5 Claims, No Drawings

METAL PHOTOPOLYMER SUBSTRATES

TECHNICAL FIELD

The present invention relates to a composite laminated article including a resin coated aluminum substrate and a liquid photocurable composition which can be cured to yield polymeric printing plates that have high peel resistance. More particularly this invention relates to a printing plate composed of a photocured ordered acrylate or methacrylate containing polyurethane and an aluminum substrate.

BACKGROUND ART

Commercial acceptance of heretofore known printing plates having a polymeric printing layer has been impeded for reasons such as unsatisfactory adherence of the polymer layer to various substrates. Good adherence of the polymer layer to the substrate is especially important in large volume printing applications such as those encountered in the newspaper industry.

Also, the substrates prepared according to the teaching of U.S. Pat. Nos. 3,748,190 and 3,826,651 do not give satisfactory adhesion to ultraviolet cured, ethylenically unsaturated polyetherurethanes such as those described in U.S. Pat. No. 4,139,436, which are to be used for exceptionally long printing runs or where better half tone quality is desired.

THE INVENTION

It has now been found by the practice of the present invention that composite laminated articles, including preferably a black resin coated aluminum substrate and a liquid photocurable ordered polymer can be cured to yield a plate which exhibits excellent adherence between the aluminum cured substrate and the ultraviolet cured polyurethane compositions.

Generally stated, the present invention in one aspect is for a composite laminated article which includes preferably a black coated sheet of conversion coated aluminum together with a liquid photocurable ordered polymer thereon. (By aluminum is meant aluminum per se and aluminum alloys containing major amounts of aluminum and minor amounts of other elements, principally other metals). The conversion coating, in turn, has a coating of a cured or set mixture of a vinyl resin, as hereinafter described, and an epoxy resin to provide aluminum with excellent adhesive properties for adhering a liquid photocurable ordered composition onto the resin coating when cured by exposure to actinic light such as that projected through a master transparency in forming articles such as polymeric printing plates.

The aluminum containing metal sheet of the present article may be of aluminum or alloys thereof which contain a major amount of aluminum. Suitable aluminum alloys are exemplified by those known in the art as Alloy 1100 and Alloy 3003 (names adopted by The Aluminum Association). These alloys contain minor amounts of silicon, iron, copper, manganese, zinc and the like. The aluminum sheet may have a temper in the range, for example, from about H12 to about H26, and preferably about H14'-18. While aluminum sheets having temper below about H12 are operable herein they generally do not provide suitable hardness for printing use. The sheet thickness may be in a range from about 5 to about 15 mils. Prior to forming the conversion coating on the aluminum sheet the aluminum is preferably cleaned in a non-etching cleaning bath in the customary manner.

It is a preferred step in carrying out this invention that the black resin coating be applied to aluminum which has been subject to a conversion coating treatment. Conversion coating treatments for aluminum are well known in the art. In general these treatments involve removal of the very thin but highly inert coating of aluminum oxide on the surface of the metal sheet and replacing it with aluminum salts which cover the surface in an interstitially permeable film intimately integral with the metal permitting deposition of further coating such as lacquers, etc. A number of conversion coatings are available commercially under various trademarks, e.g., Iridite, Alodine, Bonderite and others. These compositions are generally acidic in character and in general contain acid salts such as chromates, fluorides and the like. Some conversion coatings may contain phosphate. These coatings and their use have been described in the literature. A typical recipe, quite suitable for use in this invention, is described in Example 2 of U.S. Pat. No. 3,279,958. As shown in that example, a mixed oxide-chromate coating is deposited.

Accordingly, when the terms "conversion coating", "conversion treated", "chromate treated" and the like are used in the instant specification and claims it is to be understood that conventional and well known conversion coating processes and the results thereof are included.

After the aluminum has been conversion coated the treated sheet may be rinsed in a suitable solution, and desirably thereafter it is rinsed in water and dried. The inorganic conversion coating may be applied at a rate from about 269 to about 540 milligrams dry basis of coating per square meter of the aluminum sheet, and preferably from about 269 to about 377 milligrams dry basis per square meter. The amount of coating which is formed depends on the nature of the coating bath and the duration of contact of the aluminum sheet therewith. Generally the amount of coating may be controlled by controlling duration of such contact. In general conversion coatings of less than about 269 milligrams per square meter result in unacceptably poor adherence of the resin, while coatings in excess of 540 milligrams per square meter do not sufficiently increase resin adhesion to justify the added cost thereof.

The resin mixtures useful for coating the metals in this invention comprise a mixture of epoxy resin, either liquid or solid and poly(vinyl chloride/vinyl acetate). Terpolymers formed of maleic anhydride and the like with vinyl chloride and vinyl acetate are also useful herein. Maleic anhydride may be included in the poly(vinyl chloride/vinyl acetate) resin in an amount from about 1 to about 10 percent by weight. Unexpectedly a variety of resins not including poly(vinyl chloride/vinyl acetate) have proved to be inadequate for use herein. The resin coating may have thickness in a range from about $2.5 \times 10^{-5}$ centimeters to about $2.5 \times 10^{-3}$ centimeters and preferably from about $5.1 \times 10^{-4}$ centimeters to about $1.0 \times 10^{-3}$ centimeters. The vinyl resin may be, for example, VMCH, trademark for a poly(vinyl chloride/vinyl acetate) resin product by Union Carbide. The resin blend coating may be applied to the chromate conversion coating from a solution of the blend of resins in any suitable solvent system. Other dispersed resin forms may prove useful. Numerous solvents for VMCH are known, e.g., methylisobutylketone, methylethyl ketone, isophorone, and mixtures thereof, etc. The poly (vinyl chloride/vinyl acetate) resin may be included in the resin mixture solution in any suitable amount, and satisfactory results are obtained at 5 to 90 and preferably 5 to 40 percent by weight per 100 parts by weight of the resin mixture.

The epoxy resins useful in the blend with the vinyl chloride resin can be either liquid or solid in nature. Where the epoxy resin is a liquid, sufficient amine curative is needed to give a cured or set coating of the blend of epoxy resin and vinyl resin that does not exhibit tackiness to the finger. Better adhesion is obtained when the amount of amine curative is less than that necessary to react with all of the epoxy groups. Generally about 10 to 85 percent of an equivalent basis of amine groups per epoxy groups is used. With the solid epoxy resin the amine curative may be omitted but best cures are obtained with amine cures. For example, blends of 40 percent by weight of the solid epoxy resin of bisphenol A type available under the trademark Shell Epon 1001, with 60 percent vinyl resin and available under the trade name VMCH, gives a coating on conversion coated aluminum sheet which yields a printing plate with a photocured liquid ordered acrylate or methacrylate polyetherurethane that has a peel adhesion of at least 10,000 kilograms per square meter.

The Epon TM resin bulletin SC-71-1 of the Polymers Division of Shell Chemical Company describes these epoxy resins and broadly categorizes them as epoxy bisphenols, epoxy novalacs and those having epoxy radicals attached to an oxyphenylene radical, there being four oxyphenylene radicals attached to an ethane nucleus. Although epoxy resins of those classes listed at page 2 of this bulletin can be used, the preferred ones are the epoxy bisphenol A resins.

The amine curatives for epoxy resin curing are well known and those used more commonly commercially are diethylene triamine, triethylenetetramine, diethylaminopropylamine, menthane diamine and polyamines available under the Shell trade name Epon curing agents D, T-1, U and Z.

Any suitable means may be used for applying the resin mixture solution, preferably containing a carbon black and powdery silica in amounts of 1 to 5 parts each, onto the article. For example, the solvent-resin mixture may be deposited onto the article and thereafter drawn thereover to a suitable thickness using a draw bar or preferably be sprayed thereon. The applied resin coating over the conversion coated aluminum is cured or baked at about 125° to 185° C. for 25 minutes or more.

A printing plate may be formed of the present article, generally by depositing liquid photocurable ordered composition onto the cured or set resin layer and thereafter selectively exposing the deposited liquid composition to actinic radiation to insolubilize the exposed areas with non-exposed areas remaining generally liquid and removable.

The term "photocurable ordered composition" as used herein is intended to mean a liquid composition containing acrylate or methacrylate radicals generally having a viscosity in the range from slightly above 0 to about fied by 0 centipoises at 25° C. which isP.either photocuring or photopolymerization or both on exposure to radiation from actinic light.

The ordering of the composition is obtained by reacting the polyurethane prepolymer with the hydroxyalkyl acrylate or methacrylate, where the alkyl radical contains 1 to 10 or more carbon atoms.

Ordered compositions in accordance with this invention can be prepared by forming a polyurethane by reacting a polyether polyol having 2 or 3 hydroxyls, with an organic polyisocyanate to form a prepolymer. This reaction may occur in the presence of a diluent, preferably comprising a polyethylene polyol acrylate or methacrylate of 200 to 6000, and preferably 500 to 1500 molecular weight of polyethylene polyol with 2 to 4 hydroxyls; in the presence of an organic tin catalyst and an antioxidant; or ultimately the isocyanate can be reacted with the HEMA followed by addition of the diluent and the photosensitizing agent can be added thereto to obtain a liquid photopolymer. The prepolymer is reacted with a hydroxyalkyl acrylate or methacrylate to give a polymer which upon dilution with the diluent has a viscosity of between 1000 and 10,000 centipoises at 24° C. and preferably between 1500 to 4000 centipoises. This photopolymer ordered composition can then be applied to a substrate and exposed to ultraviolet light of wave lengths of approximately 3000 to 4000 Angstrom units to effect polymerization of the polymer in those areas receiving the ultraviolet light to produce the desired printing plate.

It is to be understood that chromate coating may be applied to either one or both of the aluminum surfaces as desired. As a general preference conversion coating is applied to both surfaces of the metal sheet for added protection. Conveniently an endless sheet of aluminum may be conversion coated on both surfaces simultaneously as by passing the endless sheet through a conversion coating bath. The coated sheet may be taken up coilwise on a receiving roll. Conversion coating both sides of the aluminum sheet is found to aid in relieving stresses which may develop in rolling up the article. Where both surfaces of the aluminum sheet are conversion coated the article is preferably formed by adhering a layer of the resin mixture to one of the coated surfaces.

BEST MODE FOR CARRYING OUT THE INVENTION

The present invention will be further illustrated by the following non-limiting examples where all percentages and parts are by weight unless otherwise indicated.

EXAMPLE 1

A 3003 type conversion coated aluminum alloy sheet having a thickness of about 0.0216 centimeter and a temper of about H12 to 14 was hot water washed and then washed with methyl ethyl ketone (MEK). The dry sheet was spray coated with an adhesion primer or coat of the type shown in Table I as a 20 percent by weight MEK solution and baked at 125° C. for 60 minutes. These baked sheets were used to make a printing plate by spreading the liquid photopolymer on the plate, exposing the photopolymer layer on the plate to ultraviolet light pulsed Xenon to develop the plate. Adhesion strips were cut from the plate and peel strength determined on an Instrom TM machine. The results of these tests are shown in Table I.

TABLE I

| Adhesion Recipe | Control | 1 | 2 | 3 |
|---|---|---|---|---|
| VMCH Resin, Parts | 0 | 5 | 5 | 0 |
| Epon 828 TM, Parts | 0 | 50 | 75 | 0 |
| Phenylene diamine, Parts | 0 | 50 | 0 | 0 |
| Catalyst, Parts* | 0 | 0 | 25 | 0 |
| Mobil VN4-2017A, Parts** | 0 | 0 | 0 | 100 |

TABLE I-continued

| Adhesion Recipe | Control | 1 | 2 | 3 |
|---|---|---|---|---|
| Peel Test | Peeled from aluminum | Photo-polymer broke | Photo-polymer broke | Photo-polymer broke |

*Catalyst is blend of m-phenylene diamine and cumene diamine
**Sheet coated with Mobil Chemical Company's carbon black containing mixture of an epoxy resin, polyvinyl chloride resin and an amine curative with the amine equivalent being less than the epoxy equivalent and a small amount of carbon black.

The photopolymers used to make the plates in Table I were ordered photopolymers. They were made using the recipes of Table II.

TABLE II

|  | A | B | C | D | E |
|---|---|---|---|---|---|
| Recipe |  |  |  |  |  |
| Polyether diol |  |  |  |  |  |
| Mol. Wt. | 2826 | 3000 | 3024 | 3016 | 2862 |
| Percent EO | 8 | 12.4 | 17.2 | 30 | 39.2 |
| Recipe |  |  |  |  |  |
| Polyether diol (parts) | 400 | 400 | 400 | 400 | 400 |
| IPDI at $R_v = 6.0$ | 188 | 178 | 176 | 177 | 186 |
| HEMA at $R_A = 1.2$ | 235 | 221 | 220 | 220 | 232 |
| Polyethylene glycol 600 dimethacrylate | 40 | 40 | 40 | 40 | 40 |
| Hydroquinone | 0.2 | 0.2 | 0.2 | 0.2 | 0.2 |
| Antioxidant | 0.4 | 0.4 | 0.4 | 0.4 | 0.4 |
| Tin catalyst | 1.0 | 1.0 | 1.0 | 1.0 | 1.0 |
| Percent NCO after 48 hours | 0.38 | 0.38 | 0.29 | 0.38 | 0.34 |
| Stabilized with n-butanol | 10 | 10 | 10 | 10 | 10 |

HEMA - Abbreviation for hydroxyethyl methacrylate.
EO - Abbreviation for ethylene oxide level in the polyether polyol.
IPDI - Abbreviation for isophorone diisocyanate.

Ordered polymers were made by reacting the polyether diol and the IPDI to form a prepolymer, then the prepolymer was reacted with the HEMA before the other ingredients were added. The excess isocyanate was neutralized after 48 hours by addition of the N-butanol to give an ordered polyetherurethane containing methacrylate groups.

When the adhesion treatment of the sheets in Table I were repeated using a non-order or random polyetherurethane the adhesion of the polymer to the plate was poor. A non-order or random polymer is one where the hydroxy acrylate or methacrylate is present at the time isocyanate is reacting with the polyether diol. Best results are obtained in the experiments of Table I when 1 to 5 percent by weight of carbon black and 1 to 5 percent of a pyrophoric powdery silica are stirred into the solution. It is to be understood that the ordered photopolymers of this invention are utilized with 0.001 to 1 percent or more of photopolymerization initiators of the type listed in U.S. Pat. No. 4,057,431. Best results are obtained with 0.5 to 0.7 part of 2-phenyl-2,2-dimethoxy acetophenone per 100 parts of base polymer, i.e., the absence of diluents.

While certain representative embodiments and details have been shown for the purpose of illustrating the invention it will be apparent to those skilled in this art that various changes and modifications may be made therein without departing from the spirit or scope of the invention.

We claim:

1. A printing plate composed of a conversion coated aluminum sheet adhered to a layer of photocured ordered polyetherurethane containing acrylates or methacrylate radicals with an adhesive composed of a set mixture of a polyvinyl chloride/vinyl acetate resin and an epoxy resin.

2. The plate of claim 1 wherein the mixture contains at least 5 parts of polyvinyl chloride/vinyl acetate resin.

3. The plate of claim 1 wherein the epoxy resin is liquid epoxy bisphenol A and the epoxy curative is an amine.

4. The plate of claim 1 wherein the ordered polyetherurethane contains 2,2-dimethoxy-2-phenylacetophenone.

5. The plates of claim 1 wherein the epoxy resin is a solid.

* * * * *

UNITED STATES PATENT OFFICE
CERTIFICATE OF CORRECTION

PATENT NO. : 4,230,770
DATED : Oct. 28, 1980
INVENTOR(S) : Raymond B. Roennau, Daniel A. Chung and Shirish Jasani It is certified that error appears in the above-identified patent and that said Letters Patent are hereby corrected as shown below:

Col. 3, line 62, delete "about fied by 0 centipoises at 25°C. which isP.either", and insert therefor --about 200,000 centipoises at 25°C. which is solidified by either--.

Signed and Sealed this

Twenty-second Day of June 1982

[SEAL]

Attest:

GERALD J. MOSSINGHOFF

Attesting Officer

Commissioner of Patents and Trademarks